United States Patent
Panasik et al.

(10) Patent No.: US 6,882,861 B2
(45) Date of Patent: Apr. 19, 2005

(54) WIRELESS USER TERMINAL AND SYSTEM HAVING SIGNAL CLIPPING CIRCUIT FOR SWITCHED CAPACITOR SIGMA DELTA ANALOG TO DIGITAL CONVERTERS

(75) Inventors: Carl M. Panasik, Garland, TX (US); Roberto Sadkowski, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 681 days.

(21) Appl. No.: 09/846,841

(22) Filed: Apr. 30, 2001

(65) Prior Publication Data

US 2002/0160732 A1 Oct. 31, 2002

(51) Int. Cl.⁷ .............................................. H04M 1/00
(52) U.S. Cl. .................... 455/553.1; 455/561; 455/309; 327/321; 327/309
(58) Field of Search ................................ 455/296, 308, 455/309, 312, 550.1, 561, 553.1; 327/309, 318, 321; 341/126–172

(56) References Cited

U.S. PATENT DOCUMENTS

| | | | | |
|---|---|---|---|---|
| 4,877,981 A | * | 10/1989 | Gomes | ........................ 327/309 |
| 5,661,422 A | | 8/1997 | Crook et al. | |
| 5,689,204 A | * | 11/1997 | Song | ........................... 327/326 |
| 6,084,467 A | * | 7/2000 | Muza | ........................... 330/69 |
| 6,229,470 B1 | * | 5/2001 | Sadkowski et al. | ......... 341/143 |
| 6,424,280 B1 | * | 7/2002 | Sadkowski | ................... 341/143 |
| 6,476,745 B1 | * | 11/2002 | Evans et al. | ................ 341/139 |

FOREIGN PATENT DOCUMENTS

| | | |
|---|---|---|
| WO | WO 82/04508 | 12/1982 |
| WO | WO 96/08878 | 3/1996 |
| WO | WO 96/10868 | 4/1996 |

* cited by examiner

Primary Examiner—Nguyen T. Vo
Assistant Examiner—Nhan T Le
(74) Attorney, Agent, or Firm—Ronald O. Neerings; Wade James Brady, III; Frederick J. Telecky, Jr.

(57) ABSTRACT

A wireless user terminal (42) and system (40) implementing a mixed signal CODEC (100) including an improved sigma-delta ADC (18) which limits input signals into a switched capacitor configuration and avoids adding circuit overhead in the signal path is disclosed herein. This sigma-delta analog-to-digital converter (18), having an input signal and an output signal, includes a switch ($sw_1$), a clipping circuit (20), and a known sigma-delta ADC (34). It solves the clipping signal problem by limiting the signal right at the input of the sigma-delta ADC (34). The clipping circuit (20) couples to the switch ($sw_1$) and the sigma-delta ADC (34) for switching the voltage applied to the sigma-delta ADC between the input signal ($v_{in}$) and at least one threshold voltage ($V_n$ and $V_p$).

34 Claims, 5 Drawing Sheets

WIRELESS USER TERMINAL AND SYSTEM HAVING SIGNAL CLIPPING CIRCUIT FOR SWITCHED CAPACITOR SIGMA DELTA ANALOG TO DIGITAL CONVERTERS

FILED OF THE INVENTION

This invention relates generally to the field of electronic systems and, in particular, to a wireless user terminal and system having signal clipping circuits for switched capacitor sigma delta analog-to-digital converters included within audio codec systems.

BACKGROUND OF THE INVENTION

The codifier/decodifier (CODEC) is the algorithm that handles the coding and decoding of audio signals within an electronic system. Specifically, an audio CODEC is a custom mixed-signal core providing analog-to-digital (A/D) and digital-to-analog (D/A) conversion. A simple serial interface is used to exchange digital data (D/A input and A/D output) between the application specific integrated circuit (ASIC) and CODEC core. Prior art CODEC features delta-sigma A/D and D/A oversampled converters and low power dissipation.

A typical uplink channel for a mobile phone voiceband or audio CODEC includes a microphone, amplifier, sigma-delta analog-to-digital converter (ADC) and a digital filter coupled together on one chip. This first chip couples to a digital signal processor for processing the digital signal received. Another chip includes a radio frequency (RF) modulator which is coupled to a last component that includes a RF power amplifier. The signal is transmitted over an antenna to a downlink channel for the mobile phone voiceband CODEC.

Initially, the audio CODEC receives an analog voice signal through the microphone and converts it to a digital signal. The digital signal is forwarded to a digital signal processor for processing. This signal is transmitted to a receiver. In the receiver, the digital signal is processed through the digital signal processor and forwarded to a D/A converter. The analog signal is fed to a speaker.

In most prior art CODECs, the sigma-delta ADC is scaled for a maximum output corresponding to the +3 dbm0 code of the pulse code modulation (PCM) data. The analog signal corresponding to this digital upscale value is far less than the maximum allowable dynamic range, which usually is limited by the supply range. This fact could potentially overload the A/D and consequently the digital filter. An FCC test, mandatory in the U.S., falls under this category. Once the digital filter overloads, internal clipping mechanisms prevent wrap around of the digital signal, thus creating a digital representation of a trapezoidal signal that contains harmonics with sufficient power to increase the FM modulation depth.

First and second order sigma delta analog modulators are inherently stable under large input level variations. Higher order modulators, however, can become unstable during the overload condition. Clipping the input signal to a predetermined safe operation level, prevents the modulator from going unstable, without having the need to recover stability after the overloading condition is removed. In other cases, even inherently stable sigma-delta structures have to be protected by a clipping mechanism to prevent post digital filtering from generation of a rail-to-rail digital representation of a quasi-square wave which can over-modulate the RF channel in a typical transmit CODEC channel for wireless applications.

Several implementations have been proposed to solve this problem. Most of them deal with clipping the signal in a previous analog amplifier stage. One solution is provided in U.S. patent application Ser. No. 09/351,610, which discloses a multiplexer amplifier having an analog output signal, a sigma-delta ADC having an input coupled to the analog output signal and a clipping circuit coupled to the input of the ADC for clipping the analog output signal. While this analog solution avoids saturation and provides an effective clipping mechanism to prevent wrap around of the digital signal, it is prone to overshoot and settling issues.

In present systems, however, the signal is fed to the A/D directly from external sources, such as a microphone or an RF mixer. Accordingly, many audio CODECs no longer include the microphone and amplifier. Thus, there is a need for a wireless user terminal and system that incorporate a sigma-delta analog-to-digital converter (ADC) that is free of overshoot and settling issues.

SUMMARY OF THE INVENTION

A wireless user terminal and system that implement a mixed signal CODEC including an improved sigma-delta ADC limits input signals into a switched capacitor configuration and avoids adding circuit overhead in the signal path. Additionally, the improved sigma-delta ADC substantially reduces overshoot and settling problems common in user terminals. This improved sigma-delta ADC, having an input signal and an output signal, includes a switch, a clipping circuit, and a sigma-delta ADC. It solves the clipping signal problem in wireless user terminals by limiting the signal right at the input of the sigma-delta ADC. The clipping circuit couples to the switch and the sigma-delta ADC for switching the voltage applied to the sigma-delta ADC between the input signal and at least one threshold voltage. When the input signal goes above a prescribed upper threshold, the fixed threshold voltage is applied to the sigma-delta ADC, which converts fixed threshold voltage into a digital signal. Moreover, when the input signal goes below that prescribed threshold, the incoming signal is applied to the sigma-delta ADC, which converts the incoming signal. In the alternative, when the input signal goes below a prescribed lower threshold, the fixed threshold voltage is applied to the sigma-delta ADC, which converts fixed threshold voltage. Furthermore, when the input signal goes above that prescribed threshold, the incoming signal is applied to the sigma-delta ADC, which converts the incoming signal. Given this solution, minimum power and area overhead exist.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein:

FIG. 8 illustrates the transmitted spectra for TDMA (GSM) and CDMA (IS-95) systems.

DETAILED DESCRIPTION OF PREFERRED EMBODIMENTS

Figure 1:
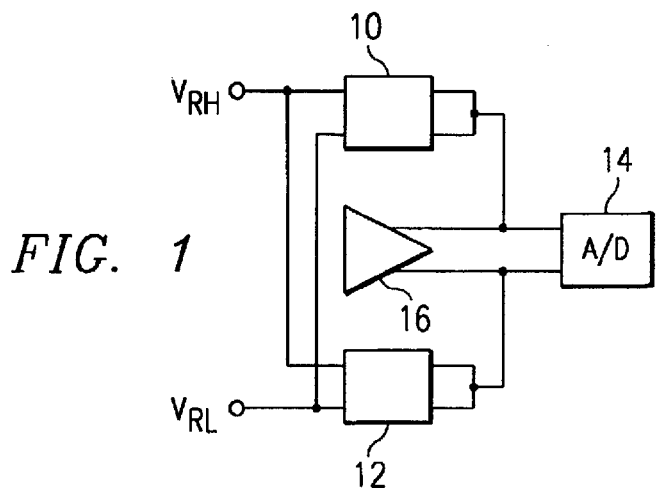
FIG. 1 is a schematic of a known simplified input stage of a sigma delta modulator.

A circuit is presented here, that clips the incoming signal to predetermined levels without disturbing the signal path and adding little overhead to the power and area requirements. In FIG. 1, analog clipping circuits 40 and 42 are coupled to the differential inputs of the sigma-delta A/D 26, to avoid overdriving the sigma-delta A/D 26. The analog clipping circuits 40 and 42 add minimum overhead in area and power. For the preferred embodiment, the maximum allowable dynamic range at the input of the sigma delta A/D 26 is a minimum of 0.625 volts and a maximum 2.375 volts. The fully differential signal is 3.5 volts (+1.75 volts to −1.75 volts). Each single ended signal is clipped at a low of 0.625 volts ($V_{RL}$) and a high of 2.375 volts ($V_{RH}$). This clipping problem solution adds a pre-amp to the signal path. The amplifier then, has to perform better than the noise specification of the channel which implies high current consumption and silicon area utilization. This solution adds a constraint to the external driving source since now the input to the chip is not capacitively coupled anymore but rather has low resistance.

Figure 2:
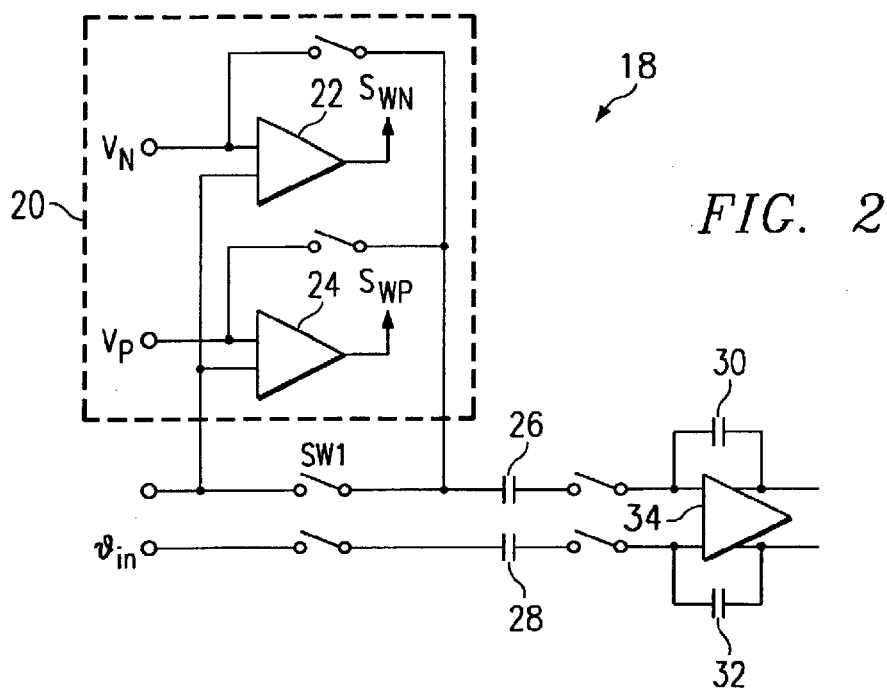
FIG. 2 is a schematic of a signal clipping circuit in accordance with the present invention.

A voiceband CODEC 18 having an improved sigma-delta A/D converter in accordance with the present invention is shown in FIG. 2. The incoming signal $v_{in}$ is connected to the comparators $C_p$ 24 and $C_n$ 22 (which can be designed for very low current since speed and offset are not a primary concern), as well. Threshold voltages, $V_p$ and $V_n$ (which can be generated from the bandgap or derived from the supply voltage through a resistor/diode division), are coupled to comparators, $C_p$ 24 and $C_n$ 22, respectively. The incoming signal is sensed by comparators $C_p$ and $C_n$, comparing the incoming signal with voltages $V_p$ and $V_n$. Comparators $C_p$ and $C_n$ are connected to switches, $sw_p$ and $sw_n$, respectively for switching in voltage levels, $V_p$ and $V_n$, respectively. All three switches, $sw_1$, $sw_p$ and $sw_n$, couple to a sigma-delta ADC 34. Switch $sw_1$ couples to receive the incoming signal $V_{in}$.

In operation, when incoming signal $v_{in}$ rises above the threshold voltage $V_p$, switch $sw_1$ opens and comparator $C_p$ turns on, closing switch $sw_p$. Accordingly, the fixed voltage $V_p$ is supplied to the sigma delta ADC 34. When the value of the signal goes below the threshold voltage, comparator $C_p$ shuts off, opening switch $sw_p$. Simultaneously, switch $sw_1$ closes and incoming signal $v_{in}$ is supplied directly to sigma-DAC 34.

When incoming signal $v_{in}$ goes below threshold voltage $V_n$, switch $sw_1$ opens and comparator $C_n$ turns on, closing switch $sw_n$. Accordingly, the fixed voltage $V_n$ is supplied to the sigma delta ADC 34. When the value of signal $v_{in}$ rises above the threshold voltage $V_n$, the comparator $C_n$ shuts off, opening switch $sw_n$. Simultaneously, switch $sw_1$ closes and incoming signal $v_{in}$ is supplied directly to the sigma delta ADC.

Figure 3A:
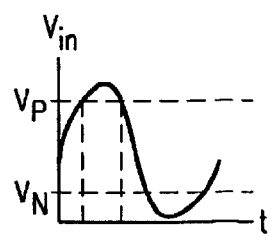
FIG. 3a is a diagram of the input voltage applied with respect to time.
Figure 3B:
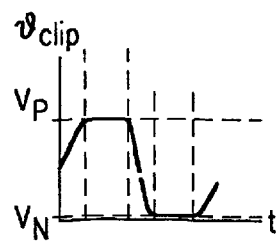
FIG. 3b is a diagram of the clipped input voltage in accordance with the present invention.

FIG. 3a displays the input signal $v_{in}$, while FIG. 3b shows the clipped input signal $v_{clip}$ seen by the sigma-delta ADC 34. As shown in FIG. 3b, when incoming signal $v_{in}$ rises above the threshold voltage $V_p$, switch $sw_1$ opens and comparator $C_p$ turns on, closing switch $sw_p$. As a result, the voltage $V_{clip}$ is equal to the threshold voltage $V_p$. When the value of the signal $v_{in}$ goes below the threshold voltage $V_p$, the comparator $C_p$ shuts off, opening switch $sw_p$. Switch $sw_1$ closes and, as a result, voltage $v_{clip}$ equals the incoming signal $v_{in}$. When the incoming signal $v_{in}$ goes below threshold voltage $V_n$, switch $sw_1$ opens and the comparator $C_n$ turns on, closing switch $sw_n$. Accordingly, voltage $v_{clip}$ equals the fixed voltage $V_n$.

The signal clipping circuit for switched capacitor sigma delta analog-to-digital converter (ADC) of the present invention can be used in a variety of telecommunication and other applications. Conveniently, the signal clipping circuit for improved sigma delta analog-to-digital converters can be implemented in wireless user terminals and base stations operating according to international standards, such as for example CDMA (Code Division Multiple Access) and GSM (Global System for Mobile Communication).

Figure 4:
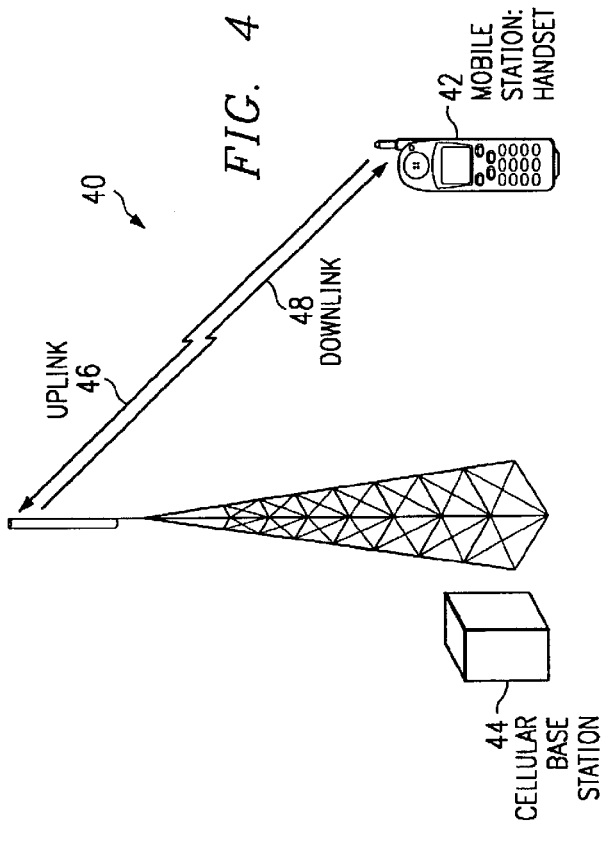
FIG. 4 illustrates a communications system that implements the signal clipping circuit of one embodiment of the present invention.

FIG. 4 illustrates a wireless communication system in which the signal clipping circuit for improved sigma delta analog-to-digital converters of the present invention may be implemented. Wireless communication system 40 comprises a wireless user terminal (a cellular handset being illustrated) 42 that communicates with a base station (a cellular base station being illustrated) 44 over an uplink channel 46 and downlink channel 48. The base station and the wireless user terminal unit operate in a similar manner.

Cellular communication in system 40 can be facilitated in Time Domain Duplex (TDD) or in Frequency Domain Duplex (FDD). In Time Domain Duplex (TDD) the communication between wireless user terminal 42 and base station 44 is on a single channel. Much like a walky-talky, the channel is shared in time by the mobile station transmitter and the base station transmitter. A time slot is dedicated to the uplink and another timeslot is dedicated to a downlink. The relative length of the uplink and downlink time slots can be adjusted to accommodate asymmetric data traffic. If it is found that downlink data traffic is on average twice that of uplink, then the downlink time slot is twice as long as the uplink time slot. In Frequency Domain Duplex (FDD) the wireless user terminal 42 and the base station 44 communicate over a pair of radio frequencies. The lower frequency is the uplink during which the mobile station sends information to the base station. Both uplink and downlink are each composed of a signal source, a transmitter, the propagation path, a receiver and a method of presenting the information. Both wireless user terminal and base station embody the invention with transmitters, which convert digital data to analog signals at high speed and with high resolution. The base station could convert the entire multi-carrier downlink signal to analog for use in a single RF transmitter. The wireless user terminal is explained in the following.

Figure 5:
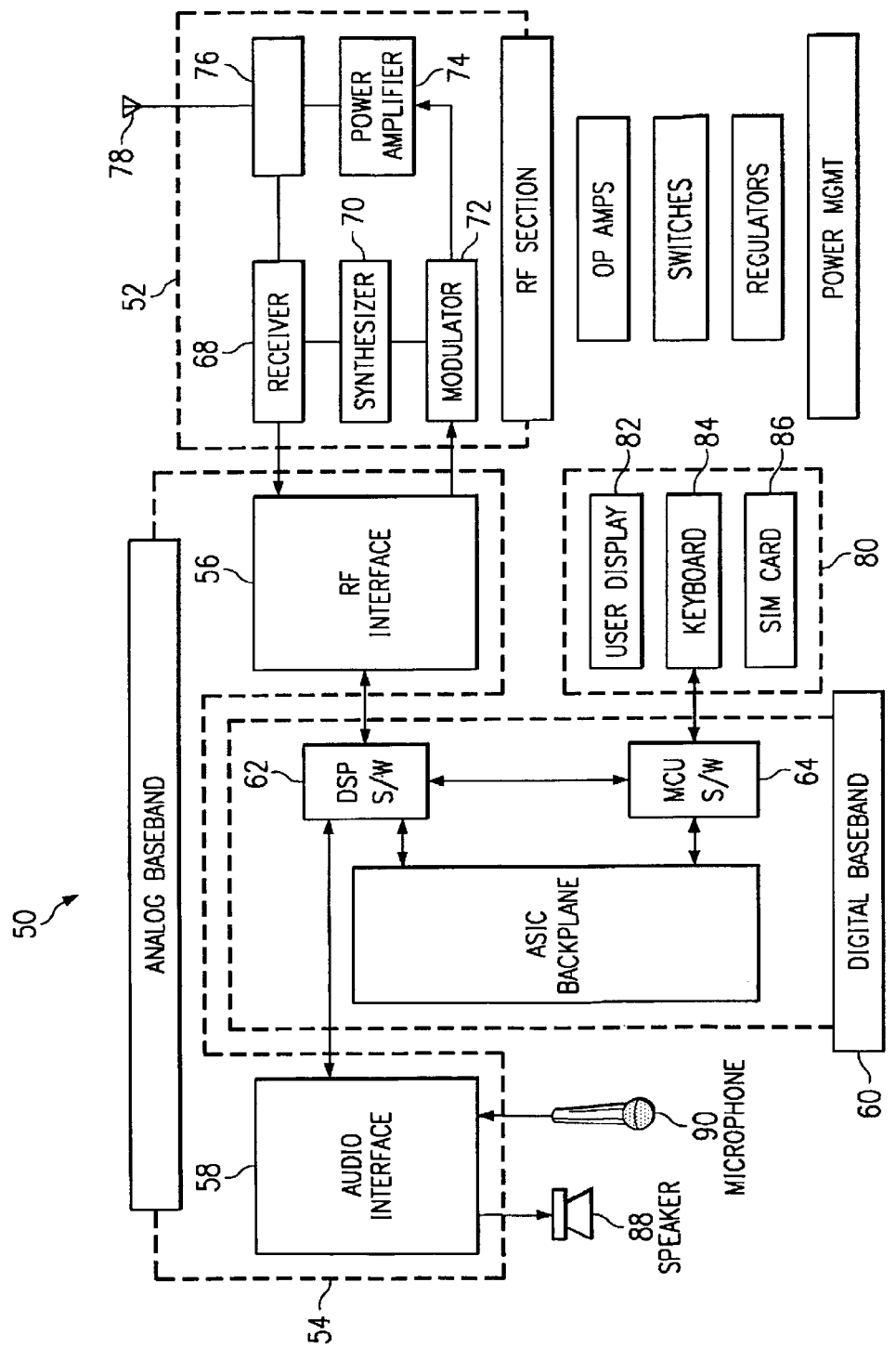
FIG. 5 illustrates a block diagram of a wireless user terminal implemented in an embodiment of the present invention.

FIG. 5 presents a top-level block diagram 50 of the wireless user terminal 42. In wireless user terminal 42, radio frequency (RF) signals are received and transmitted by the RF section 52. In the embodiment illustrated, RF section 52 comprises a duplexer 76 coupling an antenna 78 to a receiver 68 and a power amplifier 74. A modulator 72 is coupled to power amplifier 74 and to a synthesizer 70. Synthesizer 70 is further coupled to receiver 68. RF section 52 is further coupled to an analog baseband 54. In the embodiment illustrated, analog baseband 54 comprises an RF interface 56 and an audio interface 58. A speaker 88 and a microphone 90 are coupled to audio interface 58. RF interface 56 is coupled to both receiver 68 and modulator 72 of RF section 52. The analog RF interface 56 includes I and Q analog-to-digital converters (ADCs), according to the present invention, and digital-to-analog converters (DACs), for conversion between the analog and digital domains. Audio interface 58 may also include I and Q analog-to-digital converters (ADCs), according to an embodiment of the present invention, and digital-to-analog converters (DACs), for conversion between the digital and analog domains. Analog baseband 54 is further coupled to a digital baseband 60.

In the illustrated embodiment, digital baseband 60 comprises three elements: digital signal processor (DSP) 62, microcontroller unit (MCU) 64 and application specific integrated circuit (ASIC) 66. DSP 62 couples audio interface 54 to RF interface 56 and to microcontroller unit (MCU) 64. Digital signal processor (DSP) 62 and microcontroller unit (MCU) 64 are further coupled to ASIC backplane 66. Microcontroller unit (MCU) 64 is further coupled to a user interface 80, which comprises at least a user display 82 and a keyboard 84 (an optional SIM card 86 is also disclosed).

The digital signal processor (DSP) 62, provides programmable speech coding and decoding (vocoder), channel coding and decoding, equalization, demodulation and encryption. The microcontroller unit (MCU) handles level 2 & 3 protocol, radio resource management, short message services, man-machine interface and the real-time operating system. The ASIC backplane 66 performs all chip-rate processing. While top level diagram 50 illustrates RF section 52, analog baseband 54 and digital baseband 60 as being separate packages or chips, the invention contemplates substitution of any of the above with an equivalent function, such as an RF function, and/or an analog baseband function and/or a digital baseband function. The functions will remain the same even if the actual implementation varies. The invention further contemplates that RF section 52, analog baseband 54 and digital baseband 60 may be selectively combined and/or integrated into one or two packages or chips.

Figure 6:
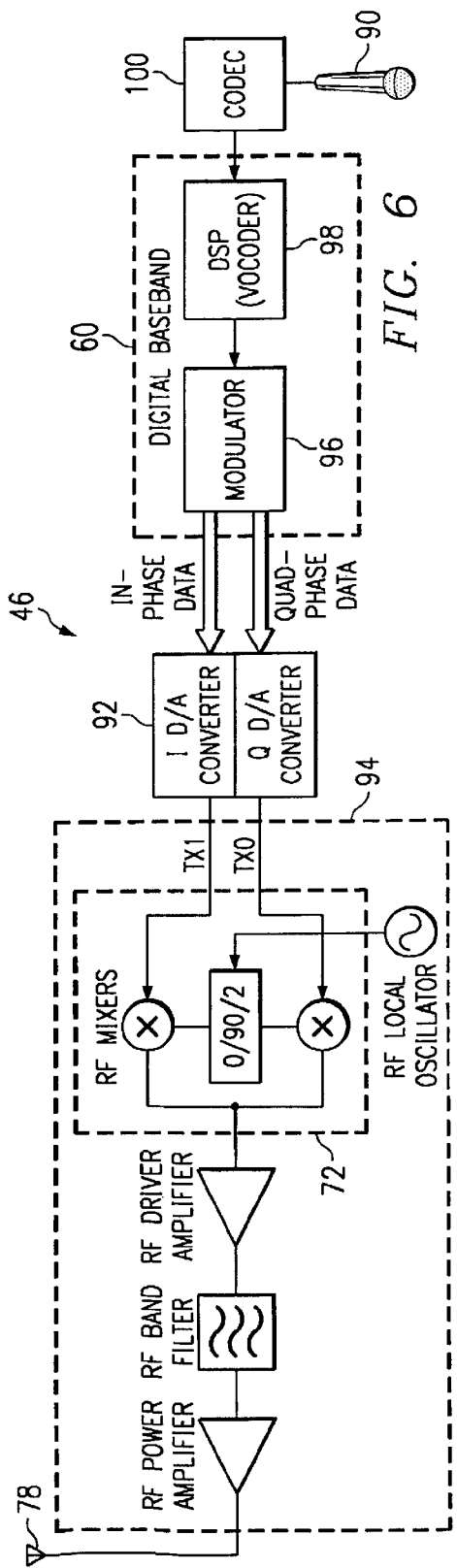
FIG. 6 illustrates a wireless user terminal block diagram that implements the signal clipping circuit according to an embodiment of the present invention.

An uplink voice processing chain 46 for a wireless user terminal 42 is illustrated in FIG. 6. This channel includes a CODEC 100 coupling a microphone 90 to a vocoder 98, a baseband modulator 96 coupling vocoder 98 to a digital-to-analog converter 92 at high speed and high resolution. An RF transmitter 94 (part of RF section 52) couples an antenna 78 to digital-to-analog converter 92. Within RF transmitter 94, modulator 72 is implemented as two RF mixers, I and Q driven by the synthesizer, implemented as an RF local oscillator. RF transmitter CODEC 100 includes an audio amplifier (not shown), sigma-delta analog-to-digital converter (ADC) (not shown) and a digital filter (not shown) coupled together on one chip. The CODEC receives an analog voice signal through the microphone and converts it to a digital signal. While CODEC 100 is shown as being separate from digital baseband 60, it may also be internal to digital baseband 60. CODEC 100 transcodes audio signals into digital words using the algorithms contained in the VOCODER. This signal is then complex modulated, converted to analog (I&Q) and applied to the transmitter. The transmitter is complex modulated at the radio frequency assigned to the handset. It uses a power amplifier coupled to the antenna 78 to transmit the digital signal, effectively communicating the (digital) voice information to the base station receiver.

Figures 7, 8A, 8B:
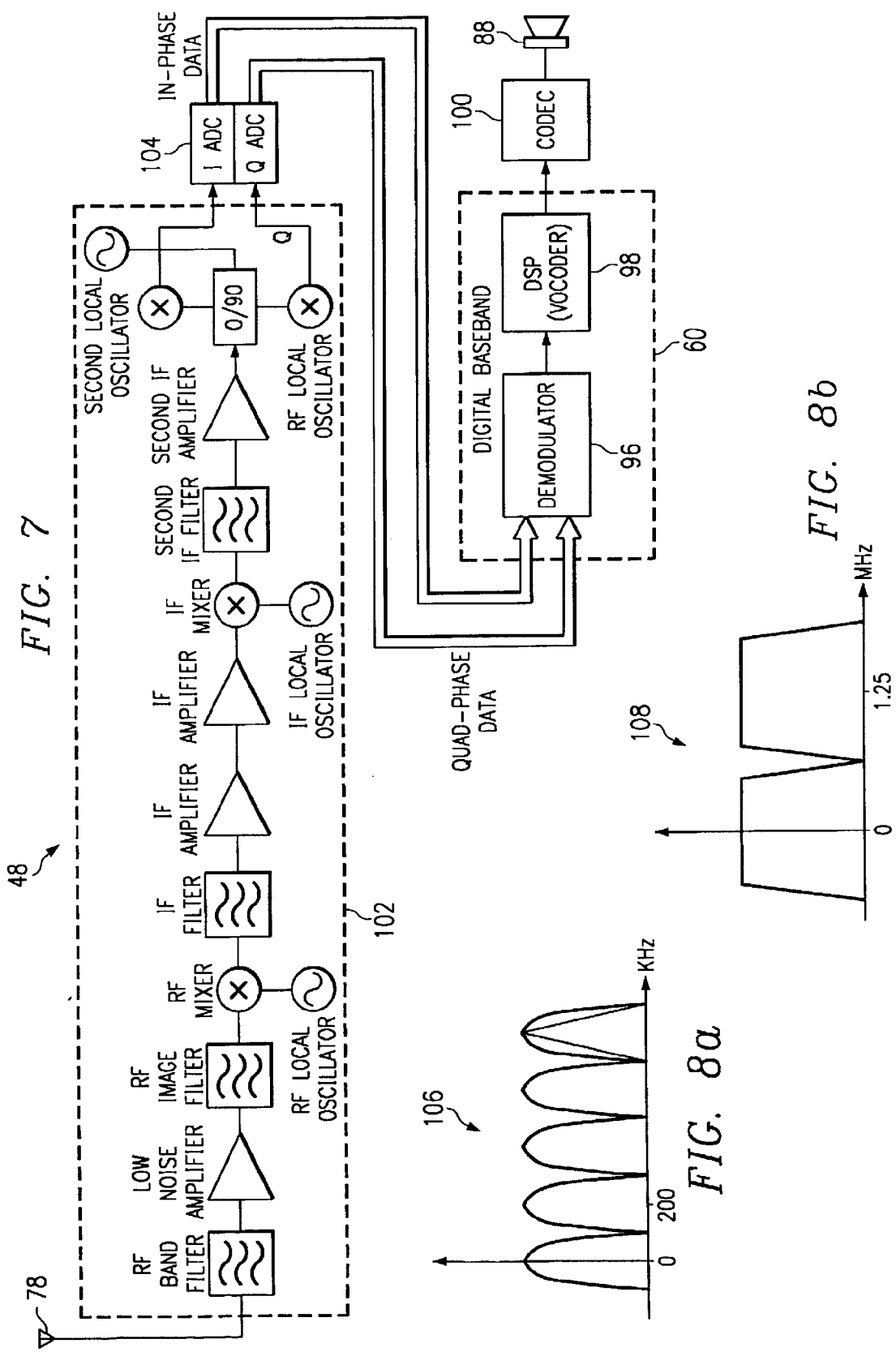
FIG. 7 illustrates a wireless user terminal receiver block diagram that implements the signal clipping circuit according to an embodiment of the present invention.

A downlink voice channel 48 for wireless user terminal 42 is illustrated in FIG. 7. This channel includes an RF receiver 102 (part of RF section 52) coupling antenna 78 to an analog-to-digital converter (ADC) 104, according to the invention, a vocoder 98 coupling a demodulator 96 to a CODEC 100, and a speaker 88 coupled to CODEC 100. While CODEC 100 is shown as being separate from digital baseband 60, it may also be internal to digital baseband 60. CODEC 100 transcodes the digital words into analog signals using the algorithms contained in the VOCODER. CODEC 100 includes a digital filter, DAC and audio amplifier coupled together on one chip. The RF receiver uses an AGC circuit which varies the IF amplifier gain as a function of the received signal. The goal is to present the analog-to-digital converters (ADCs) with a full-scale analog signal without distortion and with minimal noise.

The band structure of the cellular system in which the communication system of the present invention operates is composed of tightly packed RF carriers with very high spectral density. As illustrated in FIG. 8, the world's most widely deployed TDMA system is GSM, where the GMSK-modulated carriers are placed on a 200-Khz raster 106 with adjacent channel signal interference suppressed to −30 dBc at the first adjacent channel and −60 dBc at the second. The 2-G CDMA system used in America (IS-95) uses QPSK-modulated (at 1.2288 Msps) carriers spaced at 1.25 Mhz 108 with very little guard band. Each carrier can be modulated with up to 32 Walsh codes, which are used to separate the users.

Figure 9:
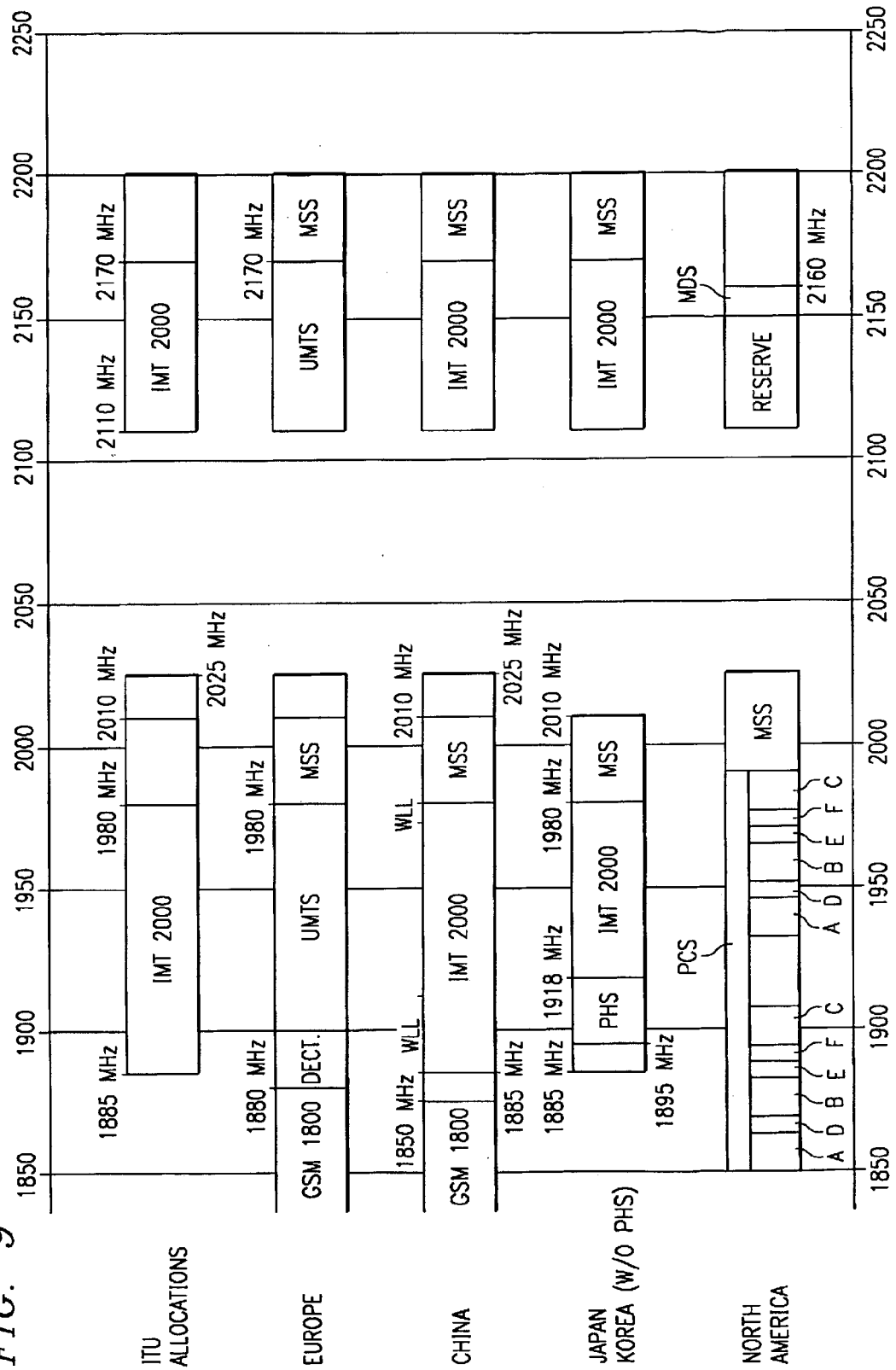
FIG. 9 illustrates a spectral definition of 2G and 3G cellular regulations.

FIG. 9 illustrates the spectral definition of the 2G and 3G cellular regulations. The base station transmitter operates on the upper frequency band. For example, in Europe the base station receives from 1900 to 1980 Mhz and transmits from 2110 to 2170 Mhz.

The signal analog-to-digital converter of the present invention can be use in other applications, such as data communication systems, hard disk drives, cd players, video displays, and any other application where there is a large amount of data that must be converted quickly.

Those skilled in the art to which the invention relates will appreciate that various substitutions, modifications and additions can be made to the described embodiments, without departing from the spirit and scope of the invention as defined by the claims.

What is claimed:

1. A wireless user terminal having radio frequency (RF) communication capability, comprising:
a digital baseband;
an RF section;
an analog baseband coupling said digital baseband to said RF section, wherein said analog baseband further comprises:
a switch having a first lead coupled to an input and a second lead coupled to an analog-to-digital converter (ADC);
a signal clipping circuit having a first input coupled to said first input of said switch, a second input coupled to receive a first reference voltage, a third input coupled to receive a second reference voltage, and an output coupled to said second lead of said switch.

2. The wireless user terminal of claim 1 wherein said analog-to-digital converter is a sigma-delta analog-to-digital converter.

3. The wireless user terminal of claim 1 wherein said wireless user terminal is a cellular handset.

4. The wireless user terminal of claim 1 wherein said digital baseband further comprises:
a digital signal processor (DSP);

a microcontroller unit (MCU) coupled to said DSP; and an ASIC backplane coupled to said DSP and said MCU.

5. The wireless user terminal of claim 1 wherein analog baseband comprises an audio interface coupled to said DSP and to a speaker and a microphone.

6. The wireless user terminal of claim 1 wherein said analog baseband comprises an RF interface coupled to said DSP and to said RF section.

7. The wireless user terminal of claim 1 wherein said analog baseband comprises an audio interface coupled to said DSP and to a speaker and a microphone and an RF interface coupled to said DSP and to said RF section.

8. The wireless user terminal of claim 1 wherein said RF section comprises a duplexer coupling a receiver and power amplifier to an antenna.

9. The wireless user terminal of claim 8 wherein said RF section further comprises a modulator coupling said RF interface to a power amplifier.

10. The wireless user terminal of claim 8 wherein said RF section further comprises a synthesizer coupled to said modulator and to said receiver.

11. The wireless user terminal of claim 1 further including a user display and a keyboard coupled to said digital baseband.

12. The wireless user terminal of claim 4 further including a user display and a keyboard coupled to said MCU.

13. The wireless user terminal of claim 6 wherein said analog-to-digital converter is located within said RF interface.

14. The wireless user terminal of claim 6 wherein said analog-to-digital converter is located within said Audio interface.

15. The wireless user terminal of claim 1 wherein the clipping circuit comprises a first branch for clipping an output signal at an upper boundary, and a second branch for clipping the output signal at a lower boundary.

16. The wireless user terminal claim 15 wherein the first branch comprises:

a comparator having an output, a first input coupled to receive a first threshold voltage and a second input coupled to receive the input signal; and a switch coupled to the output of the comparator, the output voltage of the comparator couples to the switch to open and close the switch.

17. The wireless user terminal of claim 16 wherein the first input of the comparator is a negative input and the second input of the comparator is a positive input.

18. The wireless user terminal of claim 15 wherein the second branch comprises:

a comparator having an output, a first input coupled to receive a first threshold voltage and a second input coupled to receive the input signal; and a switch coupled to the output of the comparator, the output voltage of the comparator couples to the switch to open and close the switch.

19. The wireless user terminal of claim 18 wherein the first input of the comparator is a negative input and the second input of the comparator is a positive input.

20. A radio frequency (RF) enabled communications system, comprising:

a base station; and a wireless user terminal capable of communicating with said base station via radio frequency (RF) communication, said wireless user terminal further comprising:

a digital baseband;

an RF section;

an analog baseband coupling said digital baseband to said RF section, wherein said analog baseband further comprises:

a switch having a first lead coupled to an input and a second lead coupled to an analog-to-digital converter (ADC);

a signal clipping circuit having a first input coupled to said first input of said switch, a second input coupled to receive a first reference voltage, a third input coupled to receive a second reference voltage, and an output coupled to said second lead of said switch.

21. The radio frequency (RF) enabled communications system of claim 20 wherein said analog-to-digital converter is a sigma-delta analog-to-digital converter.

22. The radio frequency (RF) enabled communications system of claim 20 wherein said wireless user terminal is a cellular handset.

23. The radio frequency (RF) enabled communications system of claim 20 wherein said digital baseband further comprises:

a digital signal processor (DSP);

a microcontroller unit (MCU) coupled to said DSP; and an ASIC backplane coupled to said DSP and said MCU.

24. The radio frequency (RF) enabled communications system of claim 20 wherein analog baseband comprises an audio interface coupled to said DSP and to a speaker and a microphone.

25. The radio frequency (RF) enabled communications system of claim 20 wherein said analog baseband comprises an RF interface coupled to said DSP and to said RF section.

26. The radio frequency (RF) enabled communications system of claim 20 wherein said analog baseband comprises an audio interface coupled to said DSP and to a speaker and a microphone and an RF interface coupled to said DSP and to said RF section.

27. The radio frequency (RF) enabled communications system of claim 20 wherein said RF section comprises a duplexer coupling a receiver and a power amplifier to an antenna.

28. The radio frequency (RF) enabled communications system of claim 27 wherein said RF section further comprises a modulator coupling a synthesizer to said power amplifier and said receiver coupled to said synthesizer.

29. The radio frequency (RF) enabled communications system of claim 28 wherein an input of said modulator is coupled to an output of said RF interface and an output of said receiver is coupled to an input of said RF interface.

30. The radio frequency (RF) enabled communications system of claim 20 further including a user display and a keyboard coupled to said digital baseband.

31. The radio frequency (RF) enabled communications system of claim 23 further including a user display and a keyboard coupled to said MCU.

32. The radio frequency (RF) enabled communications system of claim 25 wherein said digital-to-analog converter is located within said RF interface.

33. A wireless user terminal having radio frequency (RF) communication capability, comprising:

a digital baseband;

an RF section;

an analog baseband coupling said digital baseband to said RF section, wherein said analog baseband further circuitry for providing an analog-to-digital (ADC) function, wherein said circuitry comprises:

a first input;

a switch having a first lead coupled to an first input and a second lead coupled to an analog-to-digital converter (ADC);

a second input coupled to said analog-to-digital converter (ADC), said second input being further coupled to receive an input signal;

a signal clipping circuit having a first input coupled to said first input of said switch, a second input coupled to receive a first reference voltage, a third input coupled to receive a second reference voltage, and an output coupled to said second lead of said switch.

34. A wireless user terminal having radio frequency (RF) communication capability, comprising:

circuitry for providing a digital baseband function;

circuitry for providing an RF function;

circuitry for providing an analog baseband function, said circuitry for providing an analog baseband function being coupled to said circuitry for providing a digital baseband function and said circuitry for providing an RF function, wherein said circuitry for providing an analog baseband function comprises:

a first input;

a switch having a first lead coupled to an first input and a second lead coupled to an analog-to-digital converter (ADC);

a second input coupled to said analog-to-digital converter (ADC), said second input being further coupled to receive an input signal;

a signal clipping circuit having a first input coupled to said first input of said switch, a second input coupled to receive a first reference voltage, a third input coupled to receive a second reference voltage, and an output coupled to said second lead of said switch.

* * * * *